United States Patent
Kuo et al.

(10) Patent No.: US 11,158,555 B2
(45) Date of Patent: Oct. 26, 2021

(54) PACKAGE STRUCTURE HAVING SENSOR DIE WITH TOUCH SENSING ELECTRODE, AND METHOD OF FABRICATING THE SAME

(71) Applicant: Taiwan Semiconductor Manufacturing Co., Ltd., Hsinchu (TW)

(72) Inventors: Ting-Ting Kuo, Hsinchu (TW); Chih-Hua Chen, Hsinchu County (TW); Hao-Yi Tsai, Hsinchu (TW); Yu-Chih Huang, Hsinchu (TW); Chia-Hung Liu, Hsinchu (TW); Chih-Hsuan Tai, Taipei (TW); Ying-Cheng Tseng, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 15 days.

(21) Appl. No.: 15/939,293

(22) Filed: Mar. 29, 2018

(65) Prior Publication Data

US 2019/0304864 A1   Oct. 3, 2019

(51) Int. Cl.

| | |
|---|---|
| *H01L 23/31* | (2006.01) |
| *H01L 23/498* | (2006.01) |
| *H01L 25/065* | (2006.01) |
| *H01L 21/56* | (2006.01) |
| *H01L 23/538* | (2006.01) |
| *H01L 23/00* | (2006.01) |

(52) U.S. Cl.
CPC ........ *H01L 23/3114* (2013.01); *H01L 21/565* (2013.01); *H01L 23/49827* (2013.01);
(Continued)

(58) Field of Classification Search
CPC . H01L 2224/48227; H01L 2224/73265; H01L 2224/48465; H01L 2224/48247;
(Continued)

(56) References Cited

U.S. PATENT DOCUMENTS

| | | | |
|---|---|---|---|
| 8,957,503 B2 * | 2/2015 | Yang | ...................... H01L 24/19 |
| | | | 257/620 |
| 9,000,584 B2 | 4/2015 | Lin et al. | |

(Continued)

*Primary Examiner* — David Chen
(74) *Attorney, Agent, or Firm* — JCIPRNET

(57) ABSTRACT

A package structure including a semiconductor die, an insulating encapsulant, and a redistribution layer is provided. The semiconductor die includes a semiconductor substrate, a plurality of metallization layers disposed on the semiconductor substrate, and a passivation layer disposed on the plurality of metallization layers. The passivation layer has a first opening that partially expose a topmost layer of the plurality of metallization layers. The insulating encapsulant is encapsulating the semiconductor die. The redistribution layer includes at least a first dielectric layer and a first conductive layer stacked on the first dielectric layer. The first dielectric layer has a second opening that overlaps with the first opening, and a width ratio of the second opening to the first opening is in a range of 2.3:1 to 12:1. The first conductive layer is electrically connected to the topmost layer of the plurality of metallization layers through the first and second openings.

19 Claims, 7 Drawing Sheets

(52) U.S. Cl.
CPC .......... *H01L 23/5384* (2013.01); *H01L 24/03* (2013.01); *H01L 25/0657* (2013.01); *H01L 2224/73265* (2013.01)

(58) Field of Classification Search
CPC ..... H01L 2924/181; H01L 2924/15311; H01L 24/03; H01L 24/48; H01L 24/19; H01L 24/45; H01L 24/06; H01L 2224/04105; H01L 2224/12105; H01L 25/0657; H01L 23/3128; H01L 23/5384; H01L 23/3114; H01L 23/49827; H01L 21/565
USPC .......... 257/737, 738, 758, 773, 781, E23.02, 257/E23.069; 438/106, 612, 622
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2006/0065969 A1* | 3/2006 | Antol | H01L 24/48 257/700 |
| 2008/0277705 A1* | 11/2008 | Takahashi | H01L 21/76829 257/295 |
| 2008/0315366 A1* | 12/2008 | Tomita | H01L 23/522 257/620 |
| 2009/0184424 A1* | 7/2009 | Furusawa | H01L 22/32 257/758 |
| 2013/0292817 A1* | 11/2013 | LaCroix | H01L 23/5329 257/737 |
| 2014/0264930 A1* | 9/2014 | Yu | H01L 24/19 |
| 2015/0235071 A1* | 8/2015 | Chang | G06K 9/00033 382/124 |
| 2016/0099210 A1* | 4/2016 | Kwon | H01L 21/76829 |

\* cited by examiner

PACKAGE STRUCTURE HAVING SENSOR DIE WITH TOUCH SENSING ELECTRODE, AND METHOD OF FABRICATING THE SAME

BACKGROUND

In recent years, the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
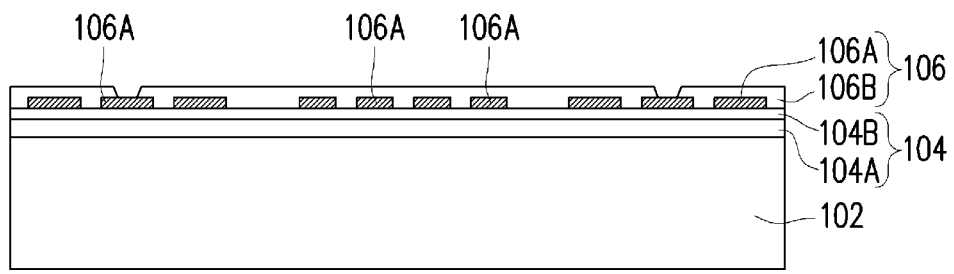
FIG. 1 to FIG. 9 are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are schematic sectional views of various stages in a method of fabricating a package structure according to some exemplary embodiments of the present disclosure. Referring to FIG. 1, in some embodiments, a carrier 102 with a buffer layer 104 coated thereon is provided. The carrier 102 may be a glass carrier, a ceramic carrier, or any suitable carrier for carrying a semiconductor wafer or a reconstituted wafer used for the method of fabricating the package structure. In some embodiments, the buffer layer 104 includes, for example, a release layer 104A and a dielectric layer 104B. The release layer 104A may be formed of a polymer-based material (such as a Light To Heat Conversion (LTHC) material), which may be removed along with the carrier 102 from the overlying structures by applying laser irradiation. In accordance with some embodiments, the release layer 104A is formed of an epoxy-based thermal-release material.

In the exemplary embodiment, the dielectric layer 104B is formed on the release layer 104A. The dielectric layer 104B may, for example, be made of photo-sensitive dielectric materials such as benzocyclobutene ("BCB"), polybenzoxazole ("PBO"), or any other suitable polymer-based dielectric materials that may be easily patterned using a photo-lithography process. In some alternative embodiments, the dielectric layer 104B is formed of a nitride such as silicon nitride, an oxide such as silicon oxide, or the like. It is noted that the materials of the carrier 102, the release layer 104A and the dielectric layer 104B are not limited to the descriptions of the embodiments. In some alternative embodiments, the dielectric layer 104B may be omitted; in other words, merely the release layer 104A is formed over the carrier 102.

As shown in FIG. 1, after forming the buffer layer 104, a first redistribution layer 106 is formed on the buffer layer 104. In some embodiments, the first redistribution layer 106 comprises at least one conductive layer 106A, and a dielectric layer 106B covering the conductive layer 106A. The conductive layer 106A is, for example, a patterned conductive layer 106A that is formed by first forming a seed layer (not shown) over buffer layer 104, forming a patterned mask (not shown) such as a photoresist over the seed layer, and then performing a metal plating on the exposed seed layer. In some embodiments, the seed layer for example includes a titanium layer, a copper layer, or the like. In some embodiments, the first redistribution layer 106 is also referred to as a backside redistribution layer, since it is located on the backside of a semiconductor die (disposed on the first redistribution layer 106 in subsequent steps). The dielectric layer 106B may be formed of the same materials of dielectric layer 104B, but not particularly limited thereto.

Figure 2:
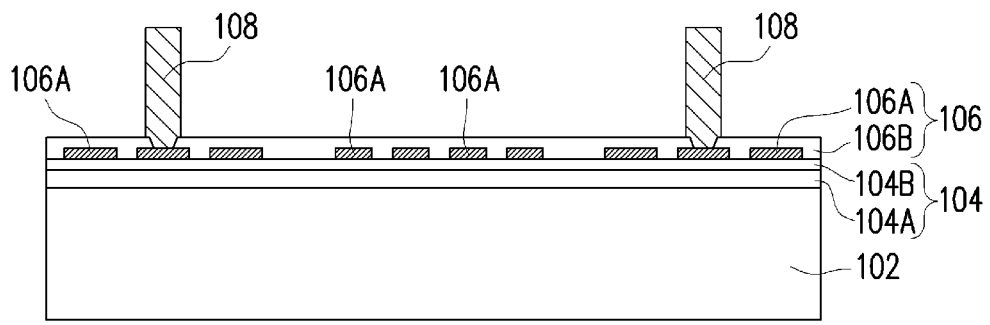

Referring to FIG. 2, in a subsequent step, the dielectric layer 106B is patterned to form openings that expose portions of the conductive layer 106A. A plurality of through insulator vias 108 is then formed on the first redistribution layer 106, filling into the openings and being electrically connected to the conductive layer 106A. In some embodiments, the through insulator vias 108 are through integrated fan-out ("InFO") vias. In some embodiments, the formation of the through insulator vias 108 includes forming a mask pattern (not shown) with openings, then forming a metallic material (not shown) filling up the openings by electroplating or deposition, and removing the mask pattern to form the through insulator vias 108 on the first redistribution layer 106. In certain embodiments, the material of the through insulator vias 108 may include copper or copper alloys, but not particularly limited thereto.

Figure 3:
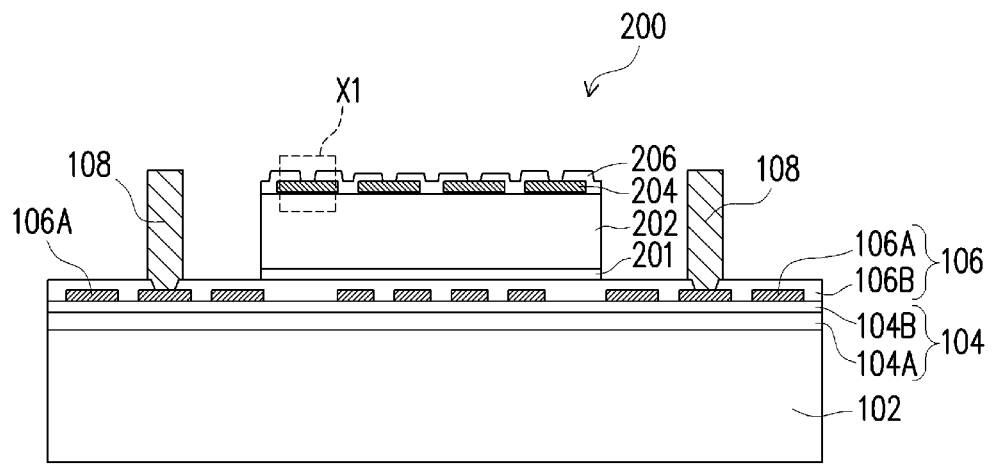

Referring to FIG. 3, after forming the through insulator vias 108, at least one semiconductor die 200 may be picked and placed on the first redistribution layer 106. In certain embodiments, the semiconductor die 200 is attached on the carrier 102 or attached to the first redistribution layer 106 through a die attach film 201. In the exemplary embodiment, the semiconductor die 200, for example, includes a semiconductor substrate 202, an interconnection layer 204 and a passivation layer 206. The semiconductor substrate 202 may be a bulk silicon substrate or a silicon-on-insulator (SOI) substrate, and further includes active components (e.g., transistors or the like) and optionally passive components (e.g., resistors, capacitors, inductors or the like) formed therein. The interconnection layer 204 may, for example, include a plurality of metallization layers and inter-dielectric layers stacked alternately (shown in later embodiments). The passivation layer 206 may be a silicon oxide layer, a silicon nitride layer, a silicon oxy-nitride layer or a dielectric layer formed of any suitable dielectric materials.

In some embodiments, the semiconductor die 200 placed on the first redistribution layer 106 may be arranged in an array, and when the semiconductor dies 200 are arranged in an array, the through insulator vias 108 may be classified into groups. The number of the semiconductor die 200 may correspond to the number of the groups of the through insulator vias 108. In the illustrated embodiment, one or more of the semiconductor die 200 may be picked and placed on the first redistribution layer 106 after the formation of the through insulator vias 108. However, the disclosure is not limited thereto. In some alternative embodiments, one or more of the semiconductor die 200 may be picked and placed on the first redistribution layer 106 before the formation of the through insulator vias 108.

In some embodiments, the semiconductor die 200 is a sensor die that includes circuits that are related to capacitance sensors for the sensing of capacitance values and the processing of the sensed capacitance values. For example, in one embodiment, the semiconductor die 200 includes circuits that are used to generate fingerprint images and to enhance the quality of the images, but not limited thereto. In some embodiments, the interconnection layer 204 may include four to six layers of metallization layer (not shown) alternately stacked with inter-dielectric layers (not shown). However, the present disclosure is not limited thereto, and the precise number of metallization layers in the interconnection layer 204 is dependent upon the design requirement of the semiconductor die 200 (sensor die).

Figure 4A:
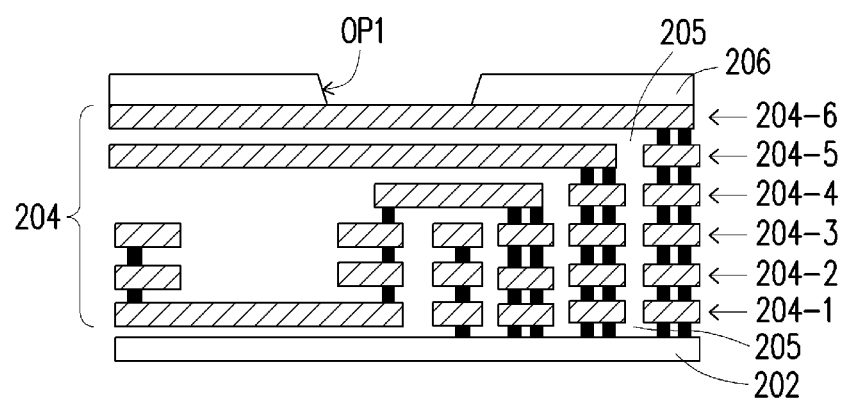

For example, FIG. 4A is an enlarged view of section X1 of the semiconductor die 200 shown in FIG. 3 in accordance with one embodiment. In the exemplary embodiment of FIG. 4A, the interconnection layer 204 includes six metallization layers (204-1 to 204-6) stacked on each other, and inter-dielectric layers 205 formed between the stacked metallization layers (204-1 to 204-6). For instance, the six metallization layers may include a first metallization layer 204-1 stacked on the semiconductor substrate 202, a second metallization layer 204-2 stacked on the first metallization layer 204-1, a third metallization layer 204-3 stacked on the second metallization layer 204-2, a fourth metallization layer 204-4 stacked on the third metallization layer 204-3, a fifth metallization layer 204-5 stacked on the fourth metallization layer 204-4, and a sixth metallization layer 204-6 stacked on the fifth metallization layer 204-5. As shown in FIG. 4A, the passivation layer 206 has a first opening OP1 that partially exposes a topmost layer (the sixth metallization layer 204-6) of the plurality of metallization layers. In such embodiment, the sixth metallization 204-6 may be treated as a touch sensing electrode, while the fifth metallization layer 204-5 may be treated as a shielding electrode. In the embodiment of FIG. 4A, although the touch sensing electrode is included in the semiconductor die 200 (sensor die), however, the present disclosure is not limited thereto. In alterative embodiments, the touch sensing electrode may be located outside of the semiconductor die 200.

Figure 4B:
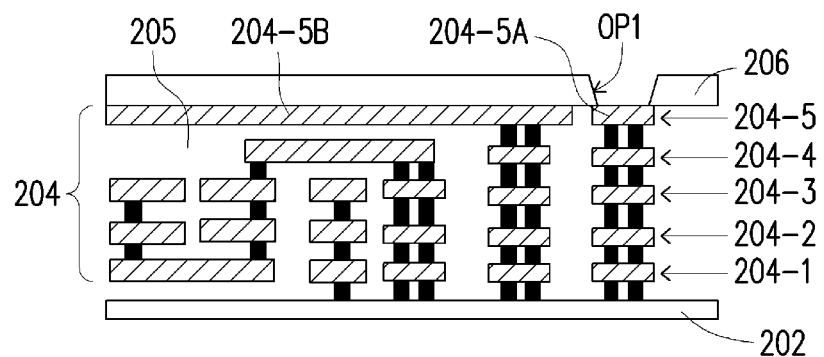

For example, FIG. 4B is an enlarged view of section X1 of the semiconductor die 200 shown in FIG. 3 in accordance with another embodiment. In the exemplary embodiment of FIG. 4B, the interconnection layer 204 includes five metallization layers (204-1 to 204-5) stacked on each other, and inter-dielectric layers 205 formed between the stacked metallization layers (204-1 to 204-5). That is, the sixth metallization layer 204-6 (acting as a touch sensing electrode) shown in the embodiment of FIG. 4A may be omitted. For instance, the five metallization layers may include a first metallization layer 204-1 stacked on the semiconductor substrate 202, a second metallization layer 204-2 stacked on the first metallization layer 204-1, a third metallization layer 204-3 stacked on the second metallization layer 204-2, a fourth metallization layer 204-4 stacked on the third metallization layer 204-3, and a fifth metallization layer 204-5 stacked on the fourth metallization layer 204-4. As shown in FIG. 4B, the topmost layer (fifth metallization layer 204-5) of the plurality of metallization layers comprises a first portion 204-5A and a second portion 204-5B, wherein the first portion 204-5A is exposed by the first opening OP1 of the passivation layer 206, while the second portion 204-5B is covered by the passivation layer 206. In such embodiment, the touch sensing electrode is omitted from the sensor die (semiconductor die 200), and for example, a redistribution layer formed thereafter may be treated as having the touch sensing electrode.

Figure 4C:
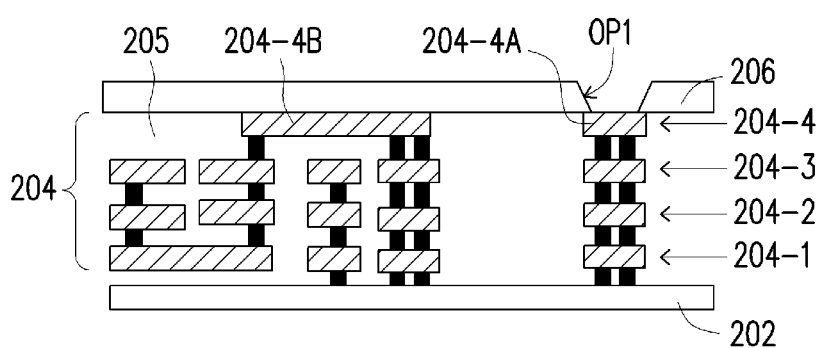

FIG. 4C is an enlarged view of section X1 of the semiconductor die 200 shown in FIG. 3 in accordance with yet another embodiment. In the exemplary embodiment of FIG. 4C, the interconnection layer 204 includes four metallization layers (204-1 to 204-4) stacked on each other, and inter-dielectric layers 205 formed between the stacked metallization layers (204-1 to 204-4). That is, the fifth metallization layer 204-5 (acting as shielding electrode) and the sixth metallization layer 204-6 (acting as a touch sensing electrode) shown in the embodiment of FIGS. 4A and 4B may be omitted. For instance, the four metallization layers may include a first metallization layer 204-1 stacked on the semiconductor substrate 202, a second metallization layer 204-2 stacked on the first metallization layer 204-1, a third metallization layer 204-3 stacked on the second metallization layer 204-2, and a fourth metallization layer 204-4 stacked on the third metallization layer 204-3. As shown in FIG. 4C, the topmost layer (fourth metallization layer 204-4) of the plurality of metallization layers comprises a first portion 204-4A and a second portion 204-4B, wherein the first portion 204-4A is exposed by the first opening OP1 of the passivation layer 206, while the second portion 204-4B is covered by the passivation layer 206. In such embodiment, the touch sensing electrode is omitted from the sensor die (semiconductor die 200), and for example, a redistribution layer formed thereafter may be treated as having the touch sensing electrode.

Figure 5:
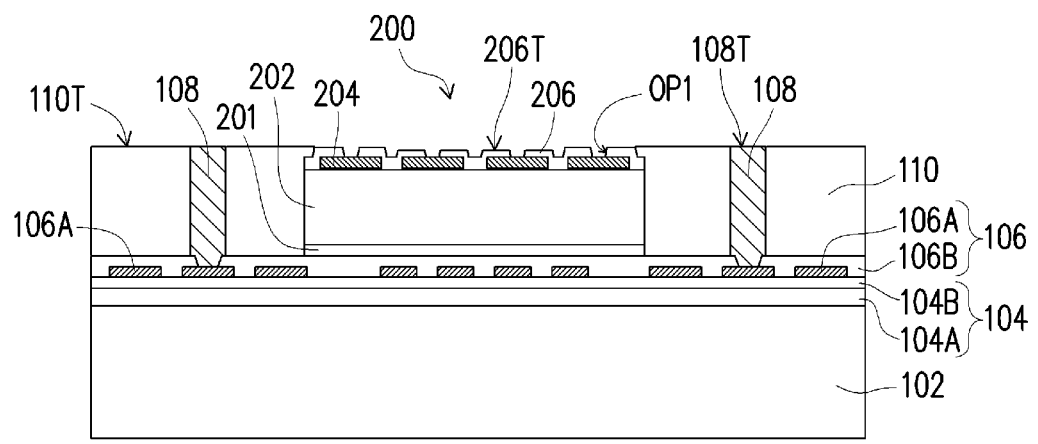

In the embodiments shown in FIG. 4A to FIG. 4C, the semiconductor die 200 having the different numbers of metallization layers may be pre-formed and placed on the first redistribution layer 106. Referring to FIG. 5, after placing the semiconductor die 200 on the first redistribution layer 106, an insulating encapsulant 110 is used to encapsulate the semiconductor die 200 and the through insulator vias 108. The insulating encapsulant 110 fills the gaps in between neighboring through insulator vias 108 (if present), and fills the gaps between the through insulator vias 108 and the semiconductor die 200. In some embodiments, the insulating encapsulant 110 may include a molding compound, a molding underfill, an epoxy, and/or a resin. In certain embodiments, the insulating encapsulant 110 may be a polymer, a resin or an epoxy based material that includes filler particles (not shown). The filler particles may be dielectric particles of $SiO_2$, $Al_2O_3$, or the like, and may have spherical shapes.

In some embodiments, the insulating encapsulant 110 is formed by first forming an insulating material (not shown) that covers the semiconductor die 200 and the through insulator vias 108, then thinning the insulating material until the top surface 206T of the passivation layer 206 and the top surface 108T of the through insulator vias 108 are exposed. The thinning process is, for example, performed by a mechanical grinding process and/or a chemical mechanical polishing (CMP) process. After the thinning process, the formed insulating encapsulant 110 has a top surface 110T that is substantially coplanar with the top surface 206T of the passivation layer 206 having the first opening OP1, and substantially coplanar with the top surface 108T of the through insulator vias 108.

Figure 6:
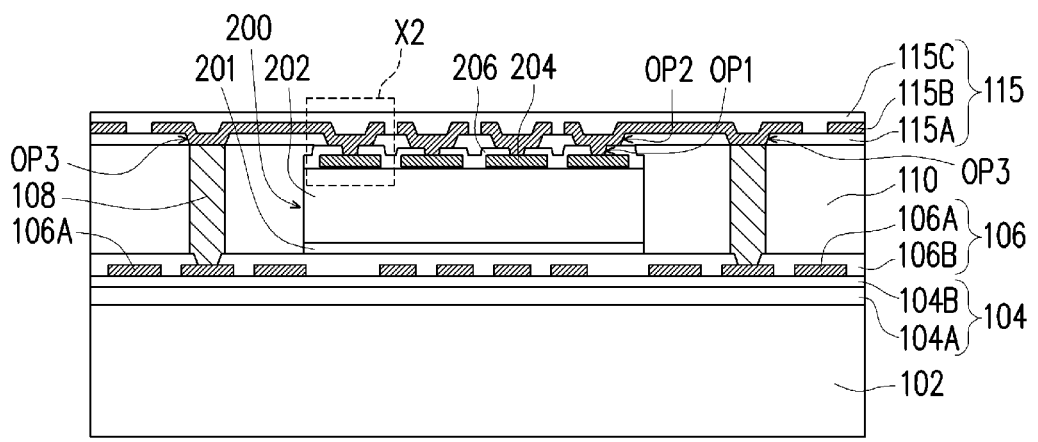

Referring to FIG. 6, after forming the insulating encapsulant 110, a second redistribution layer 115 is formed on the semiconductor die 200 (sensor die) and on the insulating encapsulant 110. In the exemplary embodiment, the second redistribution layer 115 includes a first dielectric layer 115A, a first conductive layer 115B and a second dielectric layer 115C. The first dielectric layer 115A is formed on the semiconductor die 200 and on the insulating encapsulant 110, wherein the first dielectric layer 115A has a second opening OP2 that overlaps with the first opening OP1 of the passivation layer 206. In addition, a width of the second opening OP2 is greater than a width of the first opening OP1. For example, a width ratio of the second opening OP2 to the first opening OP1 is in a range of 2.3:1 to 12:1. In some embodiments, the width of the first opening OP1 is in a range of 3 μm to 28 μm, whereas the width of the second opening OP2 is in a range of 17 μm to 35 μm, while fulfilling the above width ratio relationship. However, it should be noted that the disclosure is not limited to these exemplary width ranges. Furthermore, in some embodiments, the first dielectric layer 115A has third openings OP3 that expose the plurality of through insulator vias 108.

After forming the first dielectric layer 115A, a first conductive layer 115B (having a plurality of conductive patterns) is formed on the first dielectric layer 115A, filling into the first openings OP1, the second openings OP2 and the third openings OP3. For example, in some embodiments, the first conductive layer 115B is electrically connected to the topmost layer of the plurality of metallization layers (204-1 to 204-6) through the first opening OP1 and the second opening OP2, whereas the first conductive layer 115B is electrically connected to the plurality of through insulator vias 108 through the third openings OP3. After forming the first conductive layer 115B, a second dielectric layer 115C is formed over the first conductive layer 115B to cover the first conductive layer 115B. The first dielectric layer 115A and the second dielectric layer 115C may be formed of the same materials of dielectric layer 106B, but not particularly limited thereto. The first conductive layer 115B may be formed of the same materials of conductive layer 106A, or in some other embodiments, it may be used as a touch sensing electrode.

Figure 7A:
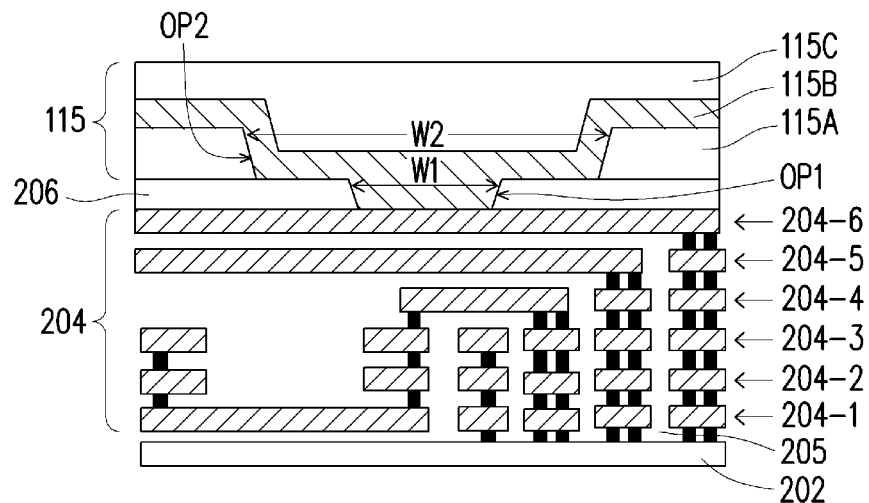

For example, FIG. 7A is an enlarged view of section X2 of the semiconductor die 200 and the second redistribution layer 115 shown in FIG. 6 in accordance with one embodiment. Similar to the embodiment of FIG. 4A, the interconnection layer 204 of FIG. 7A includes six metallization layers (204-1 to 204-6) stacked on each other, wherein the sixth metallization layer 204-6 is treated as a touch sensing electrode. In the exemplary embodiment, the passivation layer 206 has a first opening OP1 that partially exposes the sixth metallization layer 204-6 (the topmost layer), and the first dielectric layer 115A has a second opening OP2 that overlaps with the first opening OP1. Furthermore, the first conductive layer 115B is electrically connected to the sixth metallization layer 204-6 through the first opening OP1 and the second opening OP2. In the illustrated embodiment, a width W2 of the second opening OP2 is greater than a width W1 of the first opening OP1. In certain embodiments, when the interconnection layer 204 includes six metallization layers (204-1 to 204-6), then the ratio of the second opening OP2 to the first opening OP1 is approximately 2.3:1. For instance, in one exemplary embodiment, when the second opening OP2 has a width W2 of 35 μm, then the first opening OP1 may have a width W1 of approximately 15 μm.

By controlling the number of metallization layers, and by reducing the size of the topmost metallization layer that is in contact with the first conductive layer 115B (corresponding to the width ratio of openings), a parasitic capacitance of the package structure may be reduced, which in turn improves the signal to noise ratio of the structure. As a result, the width W1 of the first opening OP1 of the passivation layer 206 is set smaller than the width W2 of the second opening OP2 of the first dielectric layer 115A. On the other hand, if the second opening OP2 of the first dielectric layer 115A is set smaller than the first opening OP1 of the passivation layer 206, then an overlay process window would be insufficient, and open circuit may occur.

The embodiment shown in FIG. 7A relates to a case where the topmost layer (sixth metallization layer 204-6) of the plurality of metallization layers (204-1 to 204-6) is used as a touch sensing electrode. However, the disclosure is not limited thereto, and in some other embodiments, the first conductive layer 115B of the second redistribution layer 115 may be used as the touch sensing electrode.

Figure 7B:
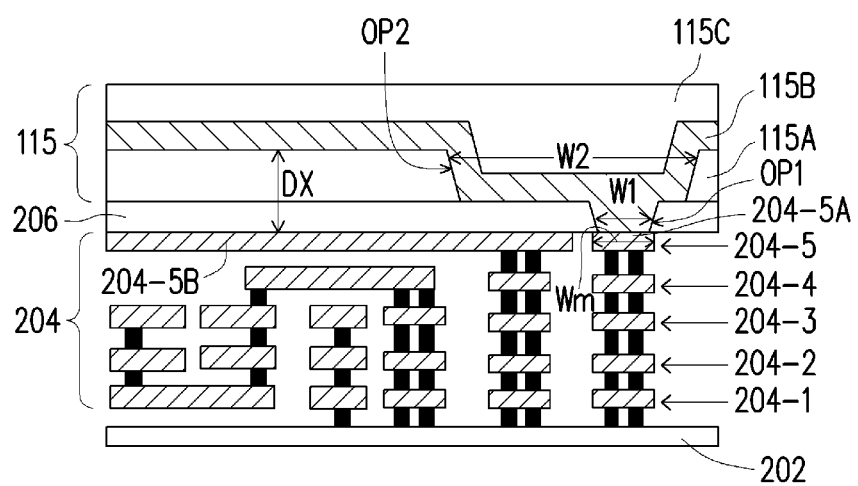

For example, FIG. 7B is an enlarged view of section X2 of the semiconductor die 200 and the second redistribution layer 115 shown in FIG. 6 in accordance with another embodiment. Similar to the embodiment of FIG. 4B, the interconnection layer 204 of FIG. 7B includes five metallization layers (204-1 to 204-5) stacked on each other, wherein the touch sensing electrode is omitted from the semiconductor die 200. In this case, the first conductive layer 115B of the second redistribution layer 115 is used as the touch sensing electrode. In the exemplary embodiment, the passivation layer 206 has a first opening OP1 that partially exposes the first portion 204-5A of the fifth metallization layer 204-5 (the topmost layer), and the first dielectric layer 115A has a second opening OP2 that overlaps with the first opening OP1. Furthermore, the first conductive layer 115B is electrically connected to the fifth metallization layer 204-5 through the first opening OP1 and the second opening OP2. In the illustrated embodiment, a width W2 of the second opening OP2 is greater than a width W1 of the first opening OP1. In certain embodiments, when the interconnection layer 204 includes five metallization layers (204-1 to 204-5), then the ratio of the second opening OP2 to the first opening OP1 is approximately 7.6:1. That is, the width W1 of the first opening OP1 in the embodiment of FIG. 7B is further reduced as compared with the width W1 of the first opening OP1 in the embodiment of FIG. 7A. For instance, in one exemplary embodiment, when the second opening OP2 has a width W2 of 23 µm, then the first opening OP1 may have a width W1 of approximately 3 µm. By reducing the number of metallization layers, and reducing the size of the topmost metallization layer (204-5) that is in contact with the first conductive layer 115B (corresponding to the width ratio of opening), a parasitic capacitance of the package structure may be reduced, which in turn improves the signal to noise ratio of the structure.

Furthermore, in the embodiment of FIG. 7B, a width Wm of the first portion 204-5A of the fifth metallization layer 204-5 is slightly greater than the width W1 of the first opening OP1, wherein a width ratio of the first portion 204-5A to the first opening OP1 is approximately 1.6:1. In addition, the second portion 204-5B of the fifth metallization layer 204-5 and the first conductive layer 115B (touch sensing electrode) are separated by a distance Dx, wherein the distance Dx is in a range of 5 µm to 10 µm. By increasing the distance Dx of the touch sensing electrode to the metallization layer (fifth metallization layer 204-5) underneath, a parasitic capacitance can be reduced, and the signal to noise ratio of the package structure can be further improved. By omitting the sixth metallization layer 204-6, a package cost can also be reduced.

Figure 7C:
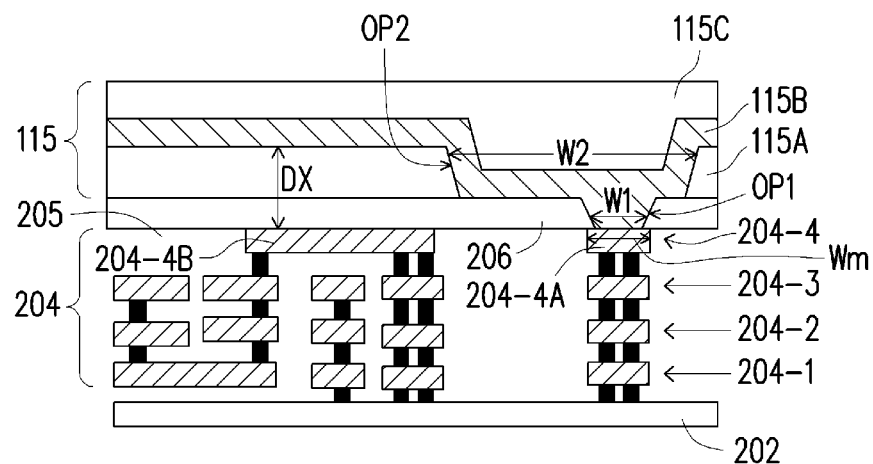

FIG. 7C is an enlarged view of section X2 of the semiconductor die 200 and the second redistribution layer 115 shown in FIG. 6 in accordance with yet another embodiment. Similar to the embodiment of FIG. 4C, the interconnection layer 204 of FIG. 7C includes four metallization layers (204-1 to 204-4) stacked on each other, wherein the touch sensing electrode is omitted from the semiconductor die 200. In this case, the first conductive layer 115B of the second redistribution layer 115 is used as the touch sensing electrode. In the exemplary embodiment, the passivation layer 206 has a first opening OP1 that partially exposes the first portion 204-4A of the fourth metallization layer 204-4 (the topmost layer), and the first dielectric layer 115A has a second opening OP2 that overlaps with the first opening OP1. Furthermore, the first conductive layer 115B is electrically connected to the fourth metallization layer 204-4 through the first opening OP1 and the second opening OP2. In the illustrated embodiment, a width W2 of the second opening OP2 is greater than a width W1 of the first opening OP1. In certain embodiments, when the interconnection layer 204 includes four metallization layers (204-1 to 204-4), then the ratio of the second opening OP2 to the first opening OP1 is approximately 7.6:1. That is, the width W1 of the first opening OP1 in the embodiment of FIG. 7C is further reduced as compared with the width W1 of the first opening OP1 in the embodiment of FIG. 7A. For instance, in one exemplary embodiment, when the second opening OP2 has a width W2 of 23 µm, then the first opening OP1 may have a width W1 of approximately 3 µm. By reducing the number of metallization layers (four metallization layers), and reducing the size of the topmost metallization layer (204-4) that is in contact with the first conductive layer 115B (corresponding to the width ratio of opening), a parasitic capacitance of the package structure may be reduced, which in turn improves the signal to noise ratio of the structure.

Similarly, in the embodiment of FIG. 7C, a width Wm of the first portion 204-4A of the fourth metallization layer 204-4 is slightly greater than the width W1 of the first opening OP1, wherein a width ratio of the first portion 204-4A to the first opening OP1 is approximately 1.6:1. In addition, the second portion 204-4B of the fourth metallization layer 204-4 and the first conductive layer 115B (touch sensing electrode) are separated by a distance Dx, wherein the distance Dx is in a range of 5 µm to 10 µm. By increasing the distance Dx of the touch sensing electrode to the metallization layer (fourth metallization layer 204-5) underneath, a parasitic capacitance can be reduced, and the signal to noise ratio of the package structure can be further improved. By omitting the fifth metallization layer 204-5 and the sixth metallization layer 204-6, a package cost can also be further reduced.

Figure 8:
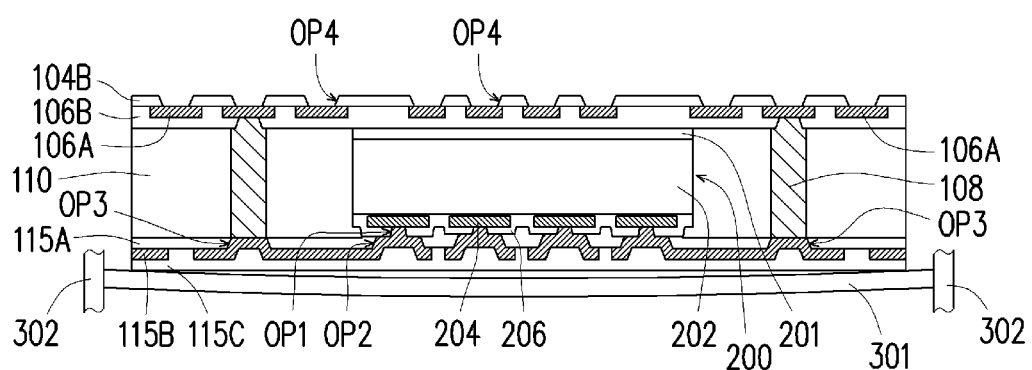

Referring to FIG. 8, after forming the second redistribution layer 115, the package structure shown in FIG. 6 is turned upside down and attached to a tape 301 (e.g., a dicing tape 301) supported by a frame 302. As illustrated in FIG. 8, the carrier 102 is debonded and is separated from the semiconductor die 200 and the dielectric layer 104B. In accordance with some embodiments, the debonding process includes projecting a light such as a laser light or an UV light on the release layer 104A so that the carrier 102 can be easily removed along with the release layer 104A. In some embodiments, the dielectric layer 104B may be peeled from the carrier 102 by irradiating laser onto the release layer 104A (e.g., the LTHC release layer). The dielectric layer 104B may then be patterned to form fourth openings OP4 that expose the patterned conductive layer 106A of the first redistribution layer 106. The formation of the fourth opening OP4 may be achieved through laser burning, photolithography process, or other known processes to form openings.

Figure 9:
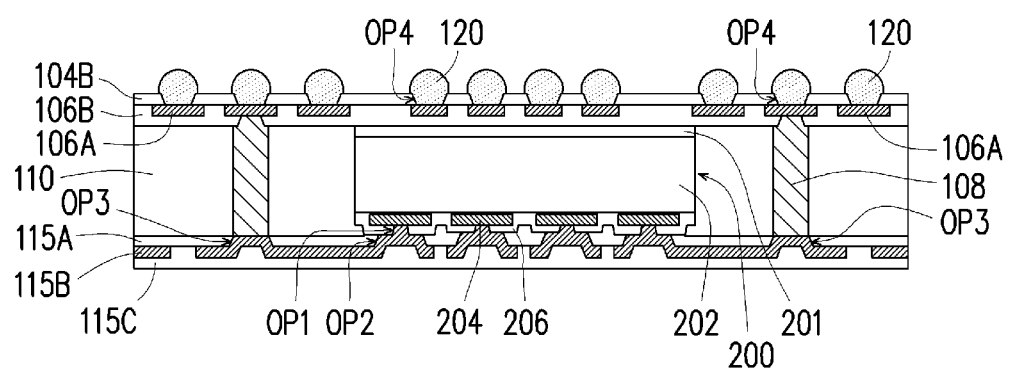

Referring to FIG. 9, after forming the fourth openings OP4, a plurality of conductive terminals 120 may then be formed in the fourth openings OP4 and on the patterned conductive layer 106A. For example, a printing step may be performed to print a solder paste in the fourth openings, followed by reflowing the solder paste to form the conductive terminals 120. Alternatively, conductive terminals 120 are formed by placing solder balls in the fourth openings OP4 then performing a reflow process. The conductive terminals 120 may then be bonded to other packages or devices based on product requirement.

In the above-mentioned embodiments, the number of metallization layers and the size of the topmost metallization layer that is in contact with the first conductive layer (corresponding to the width ratio of openings) is appropriately controlled. As a result, the width of the first opening of the passivation layer is set smaller than the width of the second opening of the first dielectric layer. Therefore, a signal to noise ratio of the package structure (having sensor dies) may be improved. Furthermore, by adjusting the number of metallization layers in the interconnection layer to five layers or four layers, a parasitic capacitance can be reduced, a signal to noise ratio of the package structure can be further improved, and a package cost can also be further reduced.

In accordance with some embodiments of the present disclosure, a package structure including a semiconductor die, an insulating encapsulant, and a redistribution layer is provided. The semiconductor die includes a semiconductor substrate, a plurality of metallization layers disposed on the semiconductor substrate, and a passivation layer disposed on the plurality of metallization layers, wherein the passivation layer has a first opening that partially exposes a topmost layer of the plurality of metallization layers. The insulating encapsulant is encapsulating the semiconductor die. The redistribution layer is disposed on the insulating encapsulant, wherein the redistribution layer includes at least a first dielectric layer and a first conductive layer stacked on the first dielectric layer, and the first dielectric layer has a second opening that overlaps with the first opening, and a width ratio of the second opening to the first opening is in a range of 2.3:1 to 12:1, and the first conductive layer is electrically connected to the topmost layer of the plurality of metallization layers through the first opening and the second opening.

In accordance with another embodiment of the present disclosure, a package structure including a first redistribution layer, a sensor die, an insulating encapsulant and a second redistribution layer is provided. The first redistribution layer has at least one conductive layer and a dielectric layer. The sensor die is disposed on the first redistribution layer, wherein the sensor die comprises a semiconductor substrate, a plurality of metallization layers formed on the semiconductor substrate, and a passivation layer disposed on the plurality of metallization layers, wherein the passivation layer has a first opening that partially exposes a topmost layer of the plurality of metallization layers. The insulating encapsulant encapsulates the sensor die, wherein a top surface of the insulating encapsulant is substantially coplanar with a top surface of the passivation layer having the first opening. The second redistribution layer is disposed on the insulating encapsulant and the sensor die, wherein the second redistribution layer comprises a first dielectric layer and a touch sensing electrode disposed on the first dielectric layer, the first dielectric layer has a second opening that overlaps with the first opening, wherein a width of the second opening is greater than a width of the first opening, and the touch sensing electrode is electrically connected to the topmost layer of the plurality of metallization layers through the first opening and the second opening.

In accordance with yet another embodiment of the present disclosure, a method of fabricating a package structure is described. The method comprises the following steps. A carrier is provided. A first redistribution layer having at least one conductive layer and a dielectric layer is formed on the carrier. A sensor die is disposed on the first redistribution layer, wherein the sensor die includes a semiconductor substrate, a plurality of metallization layers disposed on the semiconductor substrate, and a passivation layer disposed on the plurality of metallization layers, wherein the passivation layer has a first opening that partially exposes a topmost layer of the plurality of metallization layers. An insulating encapsulant is formed to encapsulate the sensor die, wherein a top surface of the insulating encapsulant is substantially coplanar with a top surface of the passivation layer having the first opening. A second redistribution layer is formed on the sensor die and the insulating encapsulant, wherein the second redistribution layer is formed by forming a first dielectric layer having a second opening that overlaps with the first opening, then forming a touch sensing electrode on the first dielectric layer, wherein a width of the second opening is greater than a width of the first opening, and the touch sensing electrode is electrically connected to the topmost layer of the plurality of metallization layers through the first opening and the second opening. The carrier is debonded, and a plurality of conductive terminals is formed on the first redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die, wherein the semiconductor die comprises a semiconductor substrate having active components formed therein, a plurality of metallization layers disposed on the semiconductor substrate, a passivation layer disposed on the plurality of metallization layers, and inter-dielectric layers surrounding the plurality of metallization layers and located in between the semiconductor substrate and the passivation layer,
   a topmost layer of the plurality of metallization layers comprises a first portion and a second portion, wherein the passivation layer covers the second portion and has a first opening that partially exposes the first portion of the topmost layer of the plurality of metallization layers,
   intermediate layers of the plurality of metallization layers comprise a third portion and a fourth portion, the third portion is located below the second portion but physically separated from the second portion without conductive elements disposed between the second portion and a topmost surface of the third portion of the intermediate layers, and the fourth portion is located below the first portion and physically joined with the first portion,
   the first portion and the second portion of the topmost layer of the plurality of metallization layers and the third portion and the fourth portion of the intermediate layers are electrically connected to the active components of the semiconductor substrate through a plurality of connecting vias, and
   in an area surrounded by the inter-dielectric layers, the first portion of the plurality of metallization layers is physically separated and electrically insulated from the second portion, and the third portion of the plurality of metallization layers is physically separated and electrically insulated from the fourth portion;
   an insulating encapsulant encapsulating the semiconductor die; and
   a redistribution layer disposed on the insulating encapsulant, wherein the redistribution layer comprises at least a first dielectric layer and a first conductive layer stacked on the first dielectric layer, and the first dielectric layer has a second opening that overlaps with the first opening, and a width ratio of the second opening to the first opening is in a range of 2.3:1 to 12:1, the first conductive layer is electrically connected to the first portion of the topmost layer of the plurality of metallization layers through the first opening and the second opening, and the first conductive layer is overlapped with and separated from the second portion in a thickness direction of the topmost layer of the plurality of metallization layers.

2. The package structure according to claim 1, wherein the semiconductor die is a sensor die, and the first conductive layer is a touch sensing electrode.

3. The package structure according to claim 2, wherein the second portion and the touch sensing electrode are separated by a distance of 5 μm to 10 μm.

4. The package structure according to claim 3, wherein a width of the first portion is greater than the width of the first opening, and a width ratio of the first portion to the first opening is approximately 1.6:1.

5. The package structure according to claim 2, wherein the semiconductor die has four metallization layers stacked on each other, and the width ratio of the second opening to the first opening is approximately 7.6:1.

6. The package structure according to claim 2, wherein the semiconductor die has five metallization layers stacked on each other, and the width ratio of the second opening to the first opening is approximately 7.6:1.

7. The package structure according to claim 1, wherein the second portion overlaps with the second opening, and does not overlap with the first opening.

8. A package structure, comprising:
a first redistribution layer having at least one conductive layer and a dielectric layer;
a sensor die disposed on the first redistribution layer, wherein the sensor die comprises a semiconductor substrate having active components formed therein, a plurality of metallization layers formed on the semiconductor substrate, and a passivation layer disposed on the plurality of metallization layers, wherein
a topmost layer of the plurality of metallization layers comprises a first portion and a second portion that is separated from the first portion, the passivation layer has a first opening that partially exposes the first portion of the topmost layer of the plurality of metallization layers,
intermediate layers of the plurality of metallization layers comprise a portion that is located below the second portion but physically separated from the second portion without conductive elements disposed between the second portion and a topmost surface of the intermediate layers, and
the first portion and the second portion of the topmost layer of the plurality of metallization layers and the portion of the intermediate layers are electrically connected to the active components of the semiconductor substrate through a plurality of connecting vias;
an insulating encapsulant encapsulating the sensor die, wherein a top surface of the insulating encapsulant is substantially coplanar with a top surface of the passivation layer having the first opening; and
a second redistribution layer disposed on the insulating encapsulant and the sensor die, wherein the second redistribution layer comprises a first dielectric layer and a touch sensing electrode disposed on the first dielectric layer, the first dielectric layer has a second opening that overlaps with the first opening, wherein a width of the second opening is greater than a width of the first opening, the touch sensing electrode is electrically connected to the first portion of the topmost layer of the plurality of metallization layers through the first opening and the second opening, and the touch sensing electrode extends over the second portion of the topmost layer of the plurality of metallization layers, and is electrically insulated from the second portion, and wherein an area of a top surface of the first portion overlapped with the touch sensing electrode is smaller than an area of a top surface of the second portion that is overlapped with the touch sensing electrode.

9. The package structure according to claim 8, wherein the second portion and the touch sensing electrode are separated by a distance of 5 μm to 10 μm.

10. The package structure according to claim 9, wherein a width of the first portion is greater than the width of the first opening, and a width ratio of the first portion to the first opening is approximately 1.6:1.

11. The package structure according to claim 8, wherein a width ratio of the second opening to the first opening is in a range of 2.3:1 to 12:1.

12. The package structure according to claim 11, wherein the sensor die has five metallization layers stacked on each other, and the width ratio of the second opening to the first opening is approximately 7.6:1.

13. The package structure according to claim 8, further comprising:
a plurality of through insulator vias penetrating through the insulating encapsulant, wherein the first dielectric layer has third openings that expose the plurality of through insulator vias, and the touch sensing electrode is electrically connected to the plurality of through insulator vias through the third openings.

14. The package structure according to claim 8, wherein the second portion overlaps with the second opening, and does not overlap with the first opening.

15. A method of fabricating a package structure, comprising:
providing a carrier;
forming a first redistribution layer having at least one conductive layer and a dielectric layer on the carrier;
disposing a sensor die on the first redistribution layer, wherein the sensor die comprises a semiconductor substrate having active components formed therein, a plurality of metallization layers disposed on the semiconductor substrate, a passivation layer disposed on the plurality of metallization layers, and inter-dielectric layers surrounding the plurality of metallization layers and located in between the semiconductor substrate and the passivation layer, wherein
a topmost layer of the plurality of metallization layers is formed with a first portion and a second portion, the passivation layer covers the second portion and has a first opening that partially exposes the first portion of the topmost layer of the plurality of metallization layers,
intermediate layers of the plurality of metallization layers are formed with a third portion and a fourth portion, the third portion is located below the second portion but physically separated from the second portion without conductive elements disposed between the second portion and a topmost surface of the third portion of the intermediate layers, and the fourth portion is located below the first portion and physically joined with the first portion,
the first portion and the second portion of the topmost layer of the plurality of metallization layers and the third portion and the fourth portion of the intermediate layers are electrically connected to the active components of the semiconductor substrate through a plurality of connecting vias, and in an area surrounded by the inter-dielectric layers, the first portion of the plurality of metallization layers is physically separated and electrically insulated from the second portion, and the third portion of the plurality of metallization layers is physically separated and electrically insulated from the fourth portion;

forming an insulating encapsulant encapsulating the sensor die, wherein a top surface of the insulating encapsulant is substantially coplanar with a top surface of the passivation layer having the first opening;

forming a second redistribution layer on the sensor die and the insulating encapsulant, wherein the forming of the second redistribution layer comprises forming a first dielectric layer having a second opening that overlaps with the first opening, then forming a touch sensing electrode on the first dielectric layer, wherein a width of the second opening is greater than a width of the first opening, the touch sensing electrode is electrically connected to the first portion of the topmost layer of the plurality of metallization layers through the first opening and the second opening, and the touch sensing electrode extends over the second portion of the topmost layer of the plurality of metallization layers, and is electrically insulated from the second portion;

debonding the carrier; and forming a plurality of conductive terminals on the first redistribution layer.

16. The method according to claim 15, wherein a width ratio of the second opening to the first opening is in a range of 2.3:1 to 12:1.

17. The method according to claim 16, wherein the sensor die is formed with four metallization layers stacked on each other, and the width ratio of the second opening to the first opening is approximately 7.6:1.

18. The method according to claim 16, wherein the sensor die is formed with five metallization layers stacked on each other, and the width ratio of the second opening to the first opening is approximately 7.6:1.

19. The method according to claim 15, the second portion and the touch sensing electrode are separated by a distance of 5 µm to 10 µm.

* * * * *